US008238503B2

(12) United States Patent
Noguchi

(10) Patent No.: US 8,238,503 B2
(45) Date of Patent: Aug. 7, 2012

(54) CLOCK DATA RECOVERING CIRCUIT AND CONTROL METHOD OF THE CLOCK DATA RECOVERING CIRCUIT

(75) Inventor: Hidemi Noguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 422 days.

(21) Appl. No.: 12/529,439

(22) PCT Filed: Jan. 16, 2008

(86) PCT No.: PCT/JP2008/050387
§ 371 (c)(1),
(2), (4) Date: Sep. 1, 2009

(87) PCT Pub. No.: WO2008/126429
PCT Pub. Date: Oct. 23, 2008

(65) Prior Publication Data
US 2010/0023826 A1    Jan. 28, 2010

(30) Foreign Application Priority Data

Mar. 30, 2007    (JP) .................................. 2007-090445

(51) Int. Cl.
*H04L 7/00*    (2006.01)
(52) U.S. Cl. ........................................ 375/371; 375/376
(58) Field of Classification Search .................. 375/371, 375/376
See application file for complete search history.

(56) References Cited

U.S. PATENT DOCUMENTS

| 4,218,771 A | * | 8/1980 | Hogge, Jr. ...................... 375/376 |
| 4,535,459 A | * | 8/1985 | Hogge, Jr. ...................... 375/324 |
| 4,538,283 A | * | 8/1985 | Hogge, Jr. ...................... 375/232 |
| 4,821,297 A | * | 4/1989 | Bergmann et al. ............. 375/376 |
| 5,896,391 A | * | 4/1999 | Solheim et al. ................ 714/704 |

FOREIGN PATENT DOCUMENTS

| JP | 2-137550 A | 5/1990 |
| JP | 10-013396 A | 1/1998 |
| JP | 11-068674 A | 3/1999 |
| JP | 2000040957 A | 2/2000 |
| JP | 2003018140 A | 1/2003 |
| JP | 2003078575 A | 3/2003 |
| JP | 2003318872 A | 11/2003 |
| JP | 2005117368 A | 4/2005 |
| JP | 3839830 B | 8/2006 |

OTHER PUBLICATIONS

International Search Report for PCT/JP2008/050387 mailed Apr. 15, 2008.

* cited by examiner

*Primary Examiner* — Juan A Torres
(74) *Attorney, Agent, or Firm* — Michael Dryja

(57) ABSTRACT

A clock data recovering circuit solving a problem in which a stable clock signal cannot be extracted is provided. A phase comparator includes a main-signal-discriminator. The main-signal-discriminator discriminates a reception signal by a clock signal to generate recovery data indicating the discrimination result. Phase comparator 2 uses the discrimination result of the main-signal-discriminator to compare phases of a reception signal and a recovery clock and outputs a phase comparison signal indicating the comparison result. A generator generates a recovery clock with a frequency corresponding to the comparison result indicated by the phase comparison signal outputted from phase comparator 2. An eye opening monitor detects an optimal discrimination point of main-signal-discriminator 1 based on a monitor signal split from the reception signal and the recovery data generated by the main-signal-discriminator. The eye opening monitor also adjusts a discrimination point of the main-signal-discriminator based on the detection result.

9 Claims, 7 Drawing Sheets

PROCESS 1

30
32 MONITOR DISCRIMINATION POINT

PROCESS 2

33 MAXIMUM PERFECT CIRCLE FIT IN EYE OPENING
31 OPTIMAL DISCRIMINATION POINT

PROCESS 3

30
35 OPTIMIZED MAIN SIGNAL DISCRIMINATION POINT

CLOCK DATA RECOVERING CIRCUIT AND CONTROL METHOD OF THE CLOCK DATA RECOVERING CIRCUIT

TECHNICAL FIELD

The present invention relates to a clock data recovering circuit (CDR: Clock and data recovery) that discriminates a received digital signal at a discrimination point to recover data and a control method of the clock data recovering circuit, and particularly, to a clock data recovering circuit that uses a phase synchronizing loop (PLL: Phase Locked Loop) suitable for integration in order to recover data and a control method of the clock data recovering circuit.

BACKGROUND ART

Due to higher-volume data communication, transmission speeds have increased. In recent years, communication systems with more than 40 Gb/s transmission speed are often reported. In general, in a digital communication system, a clock data recovering circuit, which generates a clock signal from a reception signal and that discriminates the reception signal by the clock signal to recover data, is used. Especially in recent years, a clock data recovering circuit using a phase synchronizing loop suitable for integration is widely used.

However, as the communication speed becomes faster, various factors, which have not been problems in the past, significantly affect the degradation of a received waveform. Therefore, realization of a stable communication system without a code error is becoming difficult.

For example, in an optical communication system, polarization dispersion as well as wavelength dispersion of an optical fiber as a transmission path and the noise caused by ASE (amplified spontaneous emission) generated by an optical amplification repeater degrade the received waveform. Therefore, recovery of data in a reception circuit is becoming difficult, and stable communication is becoming difficult.

In a metallic transmission system, the intersymbol interference caused by the degradation in a high-frequency component of a transmission signal and the reflection of a transmission signal at a breakpoint in a transmission path, such as a connector, degrade the received waveform. Therefore, as in the optical communication system, data recovery in a reception circuit is becoming difficult.

Furthermore, other than the waveform degradation of reception signal, there is a problem in which a discrimination point of a discriminator, which discriminates the reception signal, deviates from an optimal discrimination point. This is caused by an internal offset or a delay dispersion of a clock generation circuit that generates a clock signal from a reception signal. The discrimination point is a combination of a discrimination phase and a discrimination level determined in the clock signal.

To solve the problems, there is, conventionally, a method of manually adjusting the discrimination point of a clock data recovering circuit. However, the degradation of received waveform changes over time depending on the state of the transmission path. Therefore, adjusting the discrimination point to an optimal point is difficult in the method. Under the circumstances, a method of automatically adjusting a discrimination point to an optimal point while receiving a signal is expected.

To solve the problem, Patent Document 1 describes a digital signal reception apparatus that monitors the eye opening of a received waveform to automatically control the discrimination point of a discriminator to an optimal point.

Patent Document 1: Japanese Patent Laid-Open No. 10-13396 (sixth page, FIG. 1)

DISCLOSURE OF THE INVENTION

Problems to be Solved by the Invention

However, in the digital signal reception apparatus described in Patent Document 1, a clock generating circuit and a discriminator are independently arranged. Therefore, although the discrimination point of the discriminator can be optimized, the operating point of the clock generating circuit cannot be optimized. Thus, there is a problem in which the received waveform is significantly deformed, or in which the operating margin against jitter or noise is degraded, and a stable clock signal cannot be generated.

An object of the present invention is to provide a clock data recovering circuit and a control method of the clock data recovering circuit that solve the problem described above in which a stable clock signal cannot be generated.

Means for Solving the Problems

To attain the object, the present invention provides a clock data recovering circuit comprising: a comparator including a main discriminator that discriminates a reception signal by a clock signal to generate recovery data indicating the discrimination result, the comparator using the discrimination result of the main discriminator to compare phases of the reception signal and the clock signal and outputting a phase comparison signal indicating the comparison result; generating means for generating the clock signal with a frequency corresponding to the comparison result indicated by the phase comparison signal outputted from the comparing means; and monitoring means for detecting an optimal discrimination point of the main discriminator based on a monitor signal split from the reception signal and recovery data generated by the main discriminator and adjusting a discrimination point of the main discriminator based on the detection result.

Furthermore, the present invention provides a control method of the clock data recovering circuit, the control method comprising repeating processing of the clock data recovering circuit in the background while receiving the reception signal.

ADVANTAGE OF THE INVENTION

According to the present invention, a stable clock signal can be generated.

BEST MODE FOR CARRYING OUT THE INVENTION

Hereinafter, exemplary embodiments will be described in detail with reference to the drawings.

[First Exemplary Embodiment]

Figure 1:
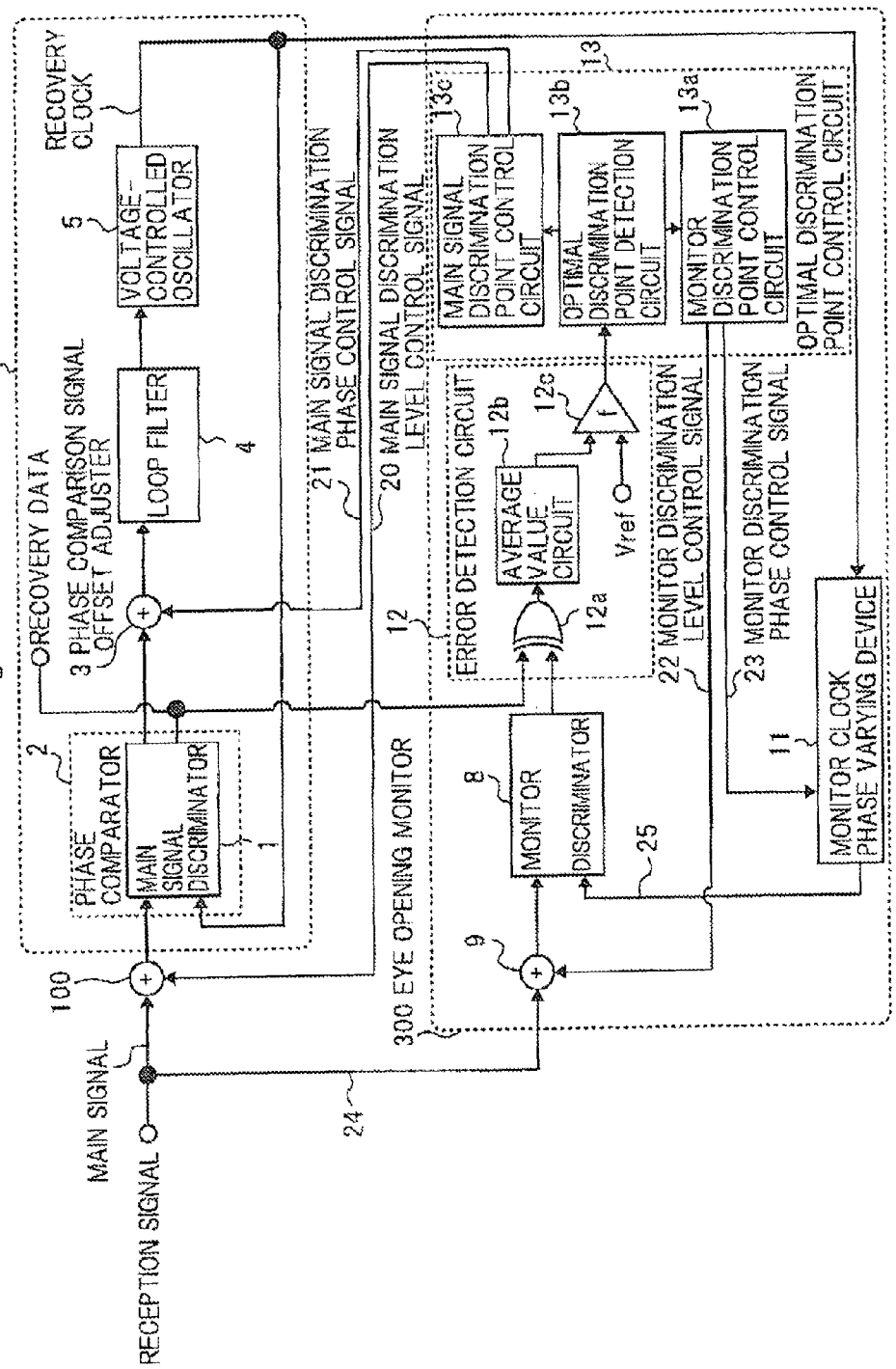
FIG. 1 is a block diagram of a configuration of a clock data recovering circuit of a first exemplary embodiment.

FIG. 1 is a block diagram of a configuration of a clock data recovering circuit of a first exemplary embodiment.

In FIG. 1, the clock data recovering circuit includes main signal offset adjuster 100, phase synchronizing loop 200, and eye opening monitor 300. Phase synchronizing loop 200 includes: phase comparator 2 including main signal discriminator 1; phase comparison signal offset adjuster 3; loop filter 4; and voltage-controlled oscillator 5. Eye opening monitor 300 includes monitor discriminator 8, monitor signal offset adjuster 9, monitor clock phase varying device 11, error detection circuit 12, and optimal discrimination point control circuit 13. Loop filter 4 and voltage-controlled oscillator 5 form a generator.

Main signal offset adjuster 100 is an example of level adjusting means. Main signal offset adjuster 100 adjusts the level of a main signal split from a reception signal. This is for adjusting a discrimination level of main signal discriminator 1.

Specifically, main signal offset adjuster 100 receives, from optimal discrimination point control circuit 13, main signal discrimination level control signal 20 for controlling the discrimination level of main signal discriminator 1. Main signal offset adjuster 100 adjusts the level of the main signal according to main signal discrimination level control signal 20.

Phase synchronizing loop 200 generates a recovery clock and discriminates the main signal by the recovery clock to generate recovery data indicating the discrimination result.

Main signal discriminator 1 discriminates the main signal by the recovery clock and generates recovery data indicating the discrimination result. Phase comparator 2 uses the discrimination result of main signal discriminator 1 to compare the phases of the main signal and the recovery clock. Phase comparator 2 then outputs a phase comparison signal indicating the comparison result.

Figure 2:
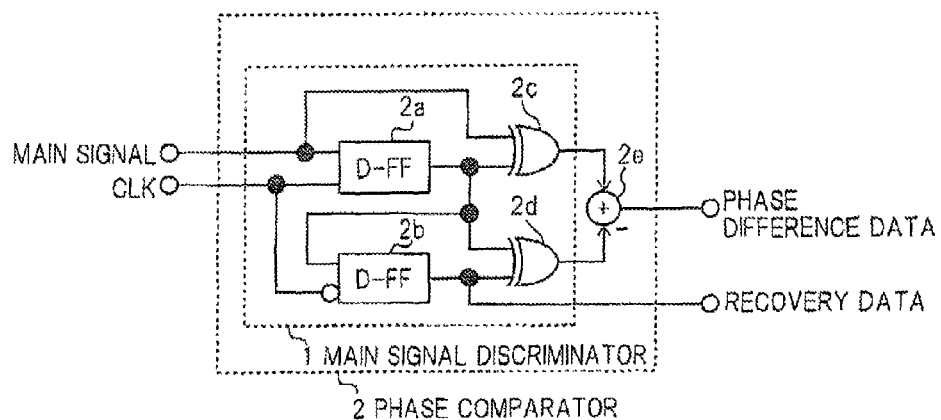
FIG. 2 is a circuit diagram of a specific example of a phase comparator.

Phase comparator 2 is formed by, for example, a Hogge-type phase comparator (see U.S. Pat. No. 4,535,459) as shown in FIG. 2. Specifically, phase comparator 2 includes flip-flops 2a and 2b, exclusive OR circuits 2c and 2d, and adder 2e. Flip-flops 2a and 2b and exclusive OR circuits 2c and 2d form main signal discriminator 1.

Flip-flop 2a uses recovery clock CLK to discriminate the main signal adjusted by main signal offset adjuster 100. Flip-flop 2b discriminates an output signal of flip-flop 2a by a reverse clock of recovery clock CLK.

Exclusive OR circuit 2c receives the main signal and the output signal of flip-flop 2a and calculates exclusive ORs of the signals. Exclusive OR circuit 2d receives the output signals of flip-flops 2a and 2b and calculates exclusive ORs of the signals. Adder 2e calculates a difference between the output signals of two exclusive OR circuits 2c and 2d and outputs the difference as a phase comparison signal.

Returning to FIG. 1, phase comparison signal offset adjuster 3 is an example of phase adjusting means. Phase comparison signal offset adjuster 3 adjusts the phase of a phase comparison signal outputted from phase comparator 2. This is for adjusting the discrimination phase of main signal discriminator 1.

Specifically, phase comparison signal offset adjuster 3 receives, from optimal discrimination point control circuit 13, main signal discrimination phase control signal 21 for controlling the discrimination phase of main signal discriminator 1. Phase comparison signal offset adjuster 3 adjusts the phase of the phase comparison signal according to main signal discrimination phase control signal 21.

The generator formed by loop filter 4 and voltage-controlled oscillator 5 generates a recovery clock with a frequency corresponding to the comparison result indicated by the phase comparison signal adjusted by phase comparison signal offset adjuster 3.

Specifically, loop filter 4 outputs a control voltage corresponding to the comparison results indicated by the phase comparison signal. Voltage-controlled oscillator 5 generates a recovery clock with a frequency corresponding to the control voltage outputted from loop filter 4.

Eye opening monitor 300 detects an optimal discrimination point of main signal discriminator 1 based on monitor signal 24 split from the reception signal and the recovery data generated by main signal discriminator 1. Eye opening monitor 300 also adjusts the discrimination point of main signal discriminator 1 based on the detection result.

Monitor discriminator 8 discriminates monitor signal 24 by monitor clock 25 and generates monitor data indicating the discrimination result.

Monitor signal offset adjuster 9 is an example of monitor level adjusting means. Monitor signal offset adjuster 9 adjusts the level of monitor signal 24. This is for adjusting the discrimination level of monitor discriminator 8.

Specifically, monitor signal offset adjuster 9 receives, from optimal discrimination point control circuit 13, monitor discrimination level control signal 22 for controlling the discrimination level of monitor discriminator 8. Monitor signal offset adjuster 9 then adjusts the phase of the phase comparison according to monitor discrimination level control signal 22.

Monitor clock phase varying device 11 is an example of monitor clock phase adjusting means. Monitor clock phase varying device 11 adjusts the phase of the recovery clock to generate a monitor clock signal. This is for adjusting the discrimination phase of monitor discriminator 8.

Specifically, monitor clock phase varying device 11 receives, from optimal discrimination point control circuit 13, monitor discrimination phase control signal 23 for controlling the discrimination phase of monitor discriminator 8. Monitor clock phase varying device 11 then adjusts the phase of the recovery clock according to monitor discrimination phase control signal 23 to generate a monitor clock signal.

Error detection circuit 12 is an example of determining means. Based on the recovery data generated by main signal discriminator 1 and the monitor data generated by monitor discriminator 8, error detection circuit 12 determines whether the discrimination point of monitor discriminator 8 and the discrimination point of main signal discriminator 1 are included in the same eye opening of the reception signal. Hereinafter, the discrimination point of main signal discriminator 1 will be called a main signal discrimination point in some cases, and the discrimination point of monitor discriminator 8 will be called a monitor discrimination point in some cases.

Error detection circuit 12 includes exclusive OR circuit 12a, average value circuit 12b, and comparator 12c.

Exclusive OR circuit 12a calculates exclusive ORs of the recovery data and the monitor data.

Average value circuit 12b calculates an average value of output signals of exclusive OR circuit 12a in a predetermined period.

Comparator 12c is an example of comparing means. Comparator 12c determines whether the average value calculated by average value circuit 12b is greater than predetermined error threshold Vref. If the average value is greater than error threshold Vref, there is a code error in the monitor data, indicating that the monitor discrimination point and the main signal discrimination point are not included in the same eye opening of the reception signal. On the other hand, if the average value is equal to or smaller than error threshold Vref, there is no code error in the monitor data, indicating that the monitor discrimination point and the main signal discrimination point are included in the same eye opening of the reception signal.

Optimal discrimination point control circuit 13 is an example of control means. Optimal discrimination point control circuit 13 sequentially adjusts the amount of adjustment of monitor signal offset adjuster 9 and the amount of adjustment of monitor clock phase varying device 11. In this way, the monitor discrimination point is scanned.

Optimal discrimination point control circuit 13 also detects an optimal discrimination point of main signal discriminator 1 based on the determination results of error detection circuit 12 corresponding to the scanned monitor discrimination points. A specific method for detecting the optimal discrimination point will be described later.

Optimal discrimination point control circuit 13 includes monitor discrimination point control circuit 13a, optimal discrimination point detection circuit 13b, and main signal discrimination point control circuit 13c. It is desirable that optimal discrimination point detection circuit 13b be formed by a CPU to deal with various calculation algorithms. This is for optimal discrimination point detection circuit 13b to calculate an optimal identifier based on the detection result of error detection circuit 12.

Main signal discrimination point control circuit 13c generates main signal discrimination level control signal 20 for controlling the discrimination level of main signal discriminator 1 and main signal discrimination phase control signal 21 for controlling the discrimination phase of main signal discriminator 1. Main signal discrimination point control circuit 13c outputs main signal discrimination level control signal 20 to main signal offset adjuster 100 and outputs main signal discrimination phase control signal 21 to phase comparison signal offset adjuster 3. Phase comparison signal offset adjuster 3 adds main signal discrimination phase control signal 21 to the phase comparison signal and controls the offset of a signal propagating in phase synchronizing loop 200 to control the discrimination phase of main signal discriminator 1.

Main signal discrimination point control circuit 13c is a circuit that generates an analog voltage. Main signal discrimination point control circuit 13c, for example, uses a DA converter to generate a desired voltage to generate main signal discrimination level control signal 20 and main signal discrimination phase control signal 21.

Monitor discrimination point control circuit 13a generates monitor discrimination level control signal 22 for controlling the discrimination level of monitor discriminator 8 and monitor discrimination phase control signal 23 for controlling the discrimination phase of monitor discriminator 8. Monitor discrimination point control circuit 13a outputs monitor discrimination level control signal 22 to monitor signal offset adjuster 9 and outputs monitor discrimination phase control signal 23 to monitor clock phase varying device 11.

As with main signal discrimination point control circuit 13c, monitor discrimination point control circuit 13a uses a DA converter to generate monitor discrimination level control signal 22. If monitor discrimination phase control signal 23 is a voltage signal, monitor discrimination point control circuit 13a uses the DA converter to generate monitor discrimination phase control signal 23. If monitor discrimination phase control signal 23 is a digital signal or if monitor discrimination phase control signal 23 includes a digital signal, monitor discrimination phase control circuit 13a transfers the control signal outputted from optimal discrimination point detection circuit 13b to monitor clock phase varying device 11, the control signal serving as monitor discrimination phase control signal 23.

Optimal discrimination point detection circuit 13b outputs the control signal to monitor discrimination point control circuit 13a and sequentially adjusts the discrimination point of monitor discriminator 8 in the phase direction and the amplitude direction. While making the adjustment, optimal discrimination point detection circuit 13b detects an eye opening of the reception signal and an optimal discrimination point of main signal discriminator 1 based on the determination results of error detection circuit 12 corresponding to the adjusted discrimination points. Optimal discrimination point detection circuit 13b also controls main signal discrimination point control circuit 13c in accordance with the detection result so that the discrimination point of main signal discriminator 1 becomes the optimal discrimination point.

Next, monitor clock phase varying device 11 will be described in detail. Monitor clock phase varying device 11 adjusts the phase of the recovery clock generated in phase synchronizing loop 200 in accordance with monitor discrimination phase control signal 23 received from monitor discrimination point control circuit 13a to generate monitor clock 25.

For example, monitor clock phase varying device 11 receives monitor discrimination phase control signal 23 as a voltage signal and adjusts the phase by the amount of adjustment according to the voltage to generate monitor clock 25.

Monitor clock phase varying device 11 can also be configured to include a phase interpolator. In this case, monitor clock phase varying device 11 generates a multiphase clock from the recovery clock, and the phase interpolator generates the monitor clock having an intermediate phase from the multiphase clock.

Figure 3:
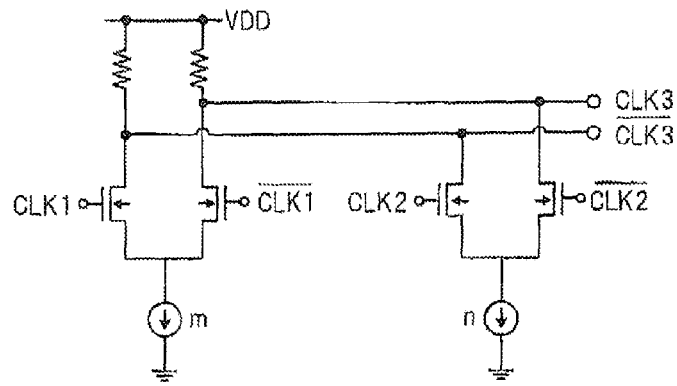
FIG. 3 is a circuit diagram of a specific example of a monitor clock phase varying device.

FIG. 3 is a circuit diagram of a configuration example of the phase interpolator of monitor clock phase varying device 11.

In FIG. 3, monitor clock phase varying device 11 includes two differential circuits. Current sources are individually connected to the differential circuits. The current ratio of the current sources will be expressed as m:n.

In one differential circuit, a recovery clock is inputted as input clocks CLK1 and CLK1bar. In the other differential circuit, a recovery clock, in which the phase is delayed for 90 degrees from input clock CLK1, is inputted as inputs CLK2 and CLK2bar. If the waveform of clock CLK1 is expressed as $\sin\theta$, the waveform of clock CLK2 can be expressed as $\cos\theta$. Each of input clocks CLK1 and CLK1 bar and inputs CLK2 and CLK2 bar indicates each phase of the multiphase clock.

In this case, the waveform of output clock CLK3 (ksinθ) is provided by Expression (1).

$$k\sin\Theta m\sin\theta + n\sin\theta = \sqrt{m^2 + n^2}\sin(\theta + \phi) \quad \text{[Expression 1]}$$

Here, $$\phi = \tan^{-1}\left(\frac{n}{m}\right). \quad \text{[Expression 2]}$$

Therefore, monitor clock phase varying device 11 can adjust the phase of two clocks CLK1 and CLK2 by changing the current ratio m:n. Output clocks CLK3 and CLK3bar of the phase interpolator are outputted to monitor discriminator 8 as monitor clock 25.

Although a circuit that performs 90-degree phase adjustment is illustrated in FIG. 3 to simplify the description, a circuit that performs 360-degree phase adjustment may also be arranged. In this case, each differential circuit can be designed to include a changeover switch between an input clock and an input terminal of the differential circuit and reverse the clock inputted to each differential circuit. In this case, the switch signal of the changeover switch is monitor discrimination phase control signal 23.

Next, using FIGS. 4 to 6, an operation example of the clock data recovering circuit of the first exemplary embodiment will be described in detail. FIG. 4 is an eye pattern diagram of a reception signal indicating a procedure for optimizing the discrimination point of the main signal discriminator. In FIG. 4, the waveform of the reception signal is distorted, and the leading edge and the falling edge are blunt. The reception signal is depicted with a broadened line.

Figure 4A:
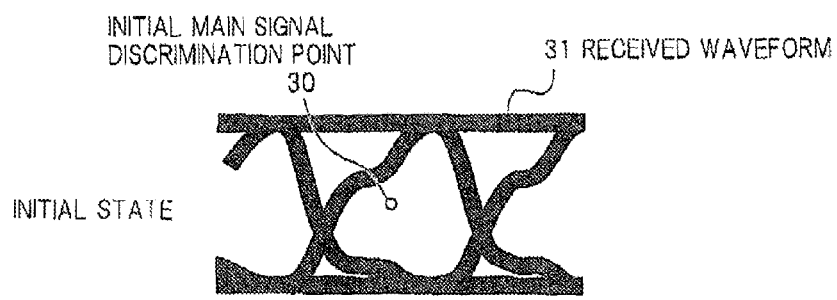
FIG. 4A is an explanatory view for explaining an operation of optimal discrimination point control.

FIG. 4A illustrates main signal discrimination point 30 and received waveform 31. Main signal discrimination point 30 illustrates a discrimination point of main signal of discriminator 1 in a state (initial state) before the adjustment to the optimal discrimination point is made. Main signal discrimination point 30 is set by phase timing of the recovery clock generated by phase synchronizing loop 200 and the central level of the amplitude of the reception signal.

Main signal discrimination point 30 deviates from the center of the eye opening of received waveform 31 due to degradation of the reception signal or internal offset or delay dispersion of phase synchronizing loop 200.

Figure 4B:
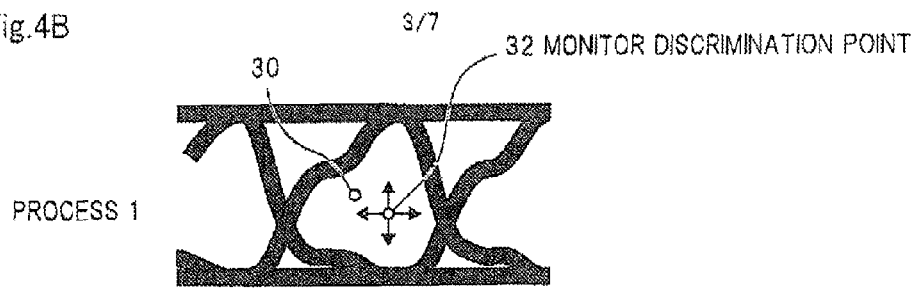
FIG. 4B is an explanatory view for explaining an operation of optimal discrimination point control.

Next, as shown in FIG. 4B, monitor discrimination point 32 is scanned in the phase direction and the amplitude direction with main signal discrimination point 30 being fixed.

Figure 5:
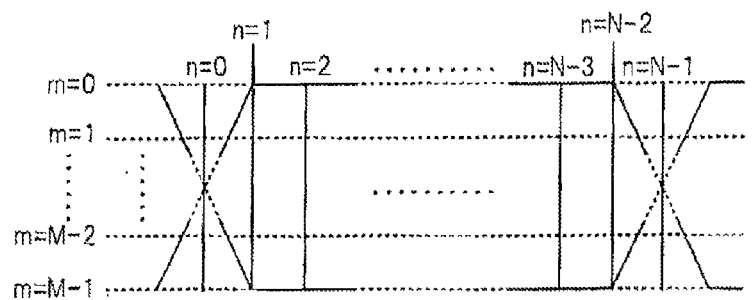
FIG. 5 is an eye pattern diagram for explaining scanning of a monitor discrimination point.

FIG. 5 is a view for explaining scanning of the monitor discrimination point. As shown in FIG. 5, the eye opening is partitioned by, for example, N lines equally spaced apart in the phase direction and M lines equally spaced apart in the amplitude direction. N×M intersection points of N lines and M lines are possible monitor discrimination points 32. Monitor discrimination points 32 are scanned in the phase direction from n=0 to n=N−1 and then scanned in the amplitude direction from m=0 to m=M−1.

Hereinafter, an operation for optimizing main signal discrimination point 30 will be further described in detail.

Figure 6:
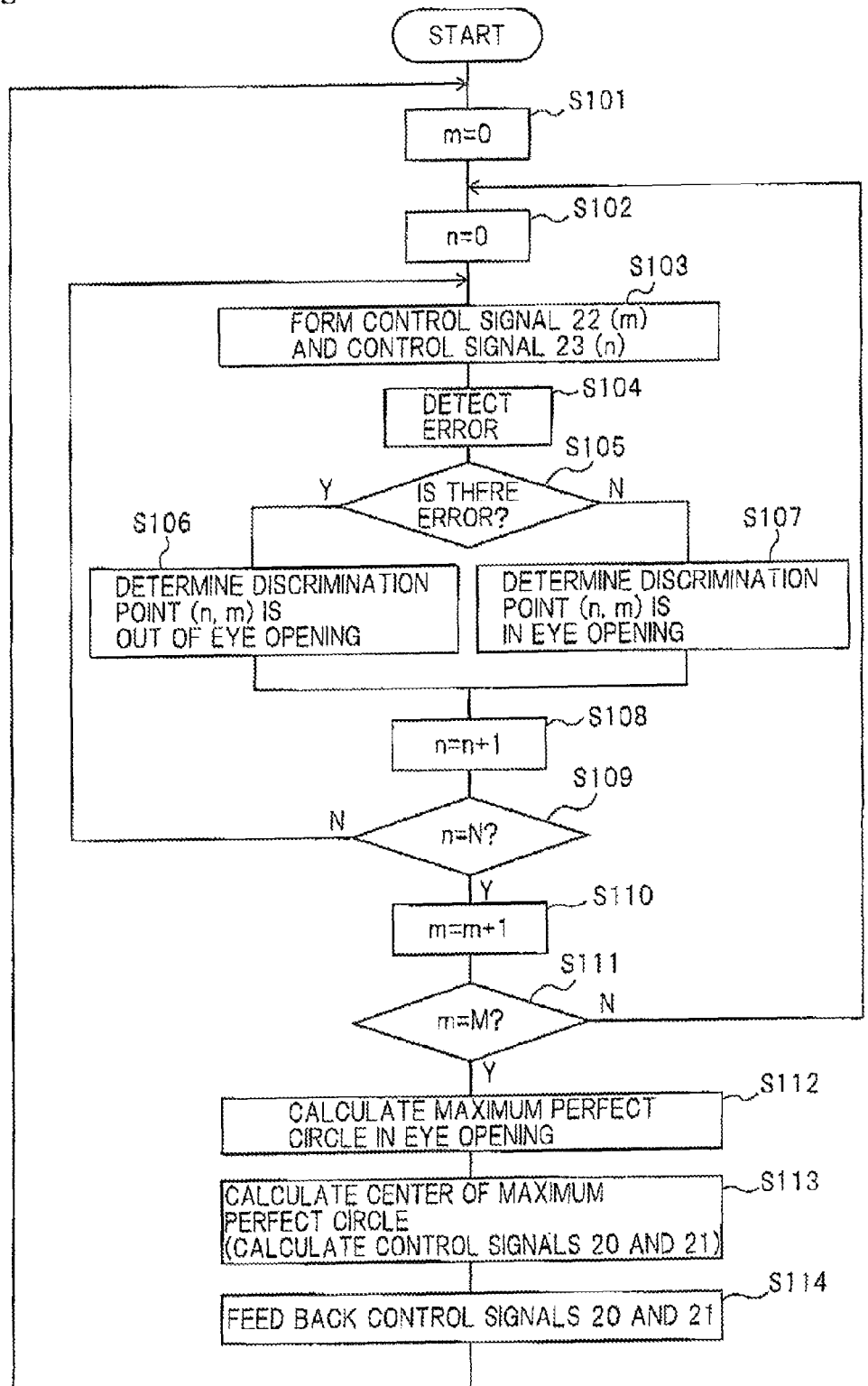
FIG. 6 is a flow chart for explaining an operation example of a clock data recovering circuit.

FIG. 6 is a flow chart for explaining an operation for optimizing main signal discrimination point 30.

Monitor discrimination point control circuit 13 sets m=0 in step S101. Monitor discrimination point control circuit 13 sets n=0 in step S102.

Subsequently, monitor discrimination point control circuit 13 generates monitor discrimination level control signal 22 and monitor discrimination phase control signal 23 corresponding to the monitor discrimination point (n, m). Monitor discrimination point control circuit 13 outputs monitor discrimination level control signal 22 to monitor signal offset adjuster 9 and outputs monitor discrimination phase control signal 23 to monitor clock phase varying device 11.

When monitor discrimination level control signal 22 is received, monitor signal offset adjuster 9 controls the level of the monitor signal according to monitor discrimination level control signal 22 to set the location of the monitor discrimination point in the phase direction to n.

When monitor discrimination phase control signal 23 is received, monitor clock phase varying device 11 controls the phase of the monitor signal according to monitor discrimination phase control signal 23 to set the location of the monitor discrimination point in the amplitude direction to m (step S103).

Monitor discriminator 8 then discriminates monitor signal 24 at the monitor discrimination point (n, m). Error detection circuit 12 receives recovery data from main signal discriminator main signal discriminator 1 and receives monitor data from monitor discriminator 8. Error detection circuit 12 calculates exclusive ORs of the recovery data and the monitor data. Error detection circuit 12 outputs a Low signal if the data have the same code and outputs a High signal if the data have different codes. This allows obtaining error pulses that indicate code errors of the recovery data and the monitor data. Error detection circuit 12 further calculates an average value of the error pulses (step S104).

In error detection circuit 12, comparator 12c compares the average value of the error pulses and error threshold Vref by the comparator and determines whether the average value is greater than error threshold Vref (step S105).

If the average value is greater than error threshold Vref, error detection circuit 12 determines that there is a code error and outputs a High signal to optimal discrimination point detection circuit 13b (step S106). In this case, monitor discrimination point 32 is out of the eye opening of main signal discrimination point 30.

On the other hand, if the average value is equal to or smaller than error threshold Vref, error detection circuit 12 determines that there is no code error and outputs a Low signal to optimal discrimination point detection circuit 13b (step S107). In this case, monitor discrimination point 32 is out of the eye opening of main signal discrimination point 30. Subsequently, optimal discrimination point detection circuit 13b increments n (step S108). Optimal discrimination point detection circuit 13b then checks whether n=N (step S109). Optimal discrimination point detection circuit 13b executes step S103 if not n=N. Optimal discrimination point detection circuit 13b moves to step S110 if n=N and increments m (step S10).

Optimal discrimination point detection circuit 13b then checks whether m=M (step S111). Optimal discrimination point detection circuit 13b executes step S102 if not m=M.

The above process is repeated until m=M. In this way, optimal discrimination point detection circuit 13b can monitor the eye opening of the reception signal. Hereinafter, a series of processes for monitoring the eye opening will be called process 1 (see FIG. 4B).

In the present exemplary embodiment, error detection circuit 12 compares the average value of the error pulses and Error threshold Vref. However, error detection circuit 12 may count the number of pulses outputted by exclusive OR circuit 12a by a digital counter and compare the count value and a predetermined error threshold pulse number.

Figure 4C:
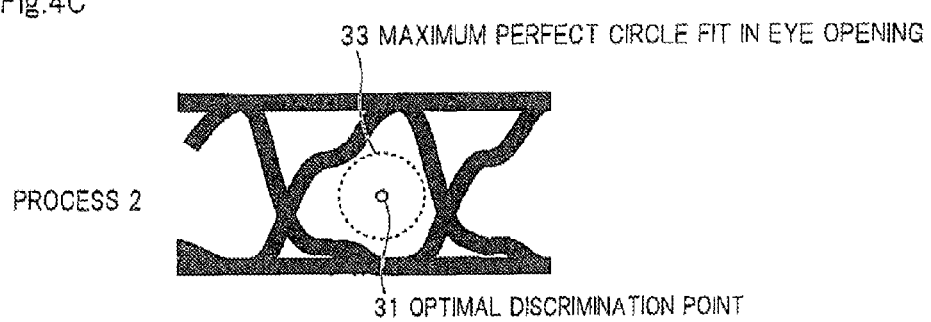
FIG. 4C is an explanatory view for explaining an operation of optimal discrimination point control.

In step S111, if m=M, optimal discrimination point detection circuit 13b calculates maximum perfect circle 33 that fits in the eye opening as shown in FIG. 4C (step S112). Optimal discrimination point detection circuit 13b then sets the center point of perfect circle 33 to optimal discrimination point 34 (step S113). This is because it can be estimated that the center point can best secure the operating margin against the noise in the amplitude direction and against the jitter in the phase direction.

In this way, optimal discrimination point detection circuit 13b calculates the optimal discrimination point of main signal discriminator 1 based on the information of the eye opening obtained in process 1. As a result, the optimal discrimination point of the currently receiving reception signal is detected. Hereinafter, the process for detecting the optimal discrimination point will be called process 2.

In the present exemplary embodiment, optimal discrimination point detection circuit 13b scales the amplitude of the eye pattern and the period of the recovery clock and numerically associates the amplitude and the phase to calculate perfect circle 33. For example, optimal discrimination point detection circuit 13b sets the amplitude of the eye pattern to 1 unit and the period of the clock to 2 units. The unit is a unit of length.

In the example above, although a perfect circuit is used to detect the optimal discrimination point, the calculation algorithm for detecting the optimal discrimination point is not limited to this calculation algorithm and may be appropriately changed. For example, optimal discrimination point detection circuit 13b may use an ellipse or a rectangle, instead of the perfect circuit. Optimal discrimination point detection circuit 13b may also detect the discrimination level, in which the length in the phase direction of the eye opening is the maximum, and set the bisection point in the phase direction as the optimal discrimination point. Optimal discrimination point detection circuit 13b may also detect the discrimination phase, in which the length in the amplitude direction of the eye opening is the maximum, and set the bisection point of the phase amplitude as the optimal discrimination point.

Figure 4D:
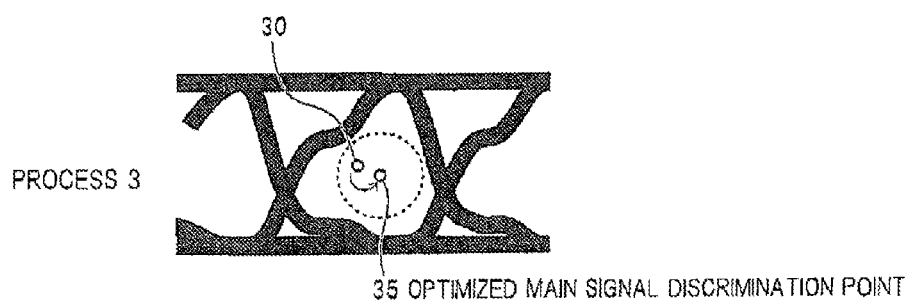
FIG. 4D is an explanatory view for explaining an operation of optimal discrimination point control.

Next, optimal discrimination point detection circuit 13b executes step S114 when step S113 is terminated. Optimal discrimination point detection circuit 13b outputs, from main signal discrimination point control circuit 13c, main signal discrimination level control signal 20 and main signal discrimination phase control signal 21 indicating the optimal discrimination point detected in step S113. As a result, as shown in FIG. 4D, the discrimination point of main signal discriminator 1 is set to the optimal discrimination point calculated in process 2.

In this case, main signal discrimination point control circuit 13c uses main signal discrimination level control signal 20 to control main signal offset adjuster 100 to set the discrimination level of the main signal discrimination point. Meanwhile, main signal discrimination point control circuit 13c feeds back main signal discrimination phase control signal 21 to phase comparison signal offset adjuster 3 to set the discrimination phase of the main signal discrimination point. In this case, phase comparison signal offset adjuster 3 adds main signal discrimination phase control signal 21 to the phase comparison signal as an offset voltage to provide an offset to the signal propagating in phase synchronizing loop 200. As a result, the stationary phase error of phase synchronizing loop 200 is controlled, and the discrimination phase of the main signal discrimination point is set to the optimal discrimination phase.

As a result of the above operation, initial main signal discrimination point 30 is changed to optimized main signal discrimination point 35. Hereinafter, a series of processes for setting the optimal discrimination point will be called process 3.

Step S101 is executed when process 3 is terminated, and then steps S101 to S114 are repeated. This allows repeating the process of clock data recovering circuit, specifically, optimization of the main signal discrimination point, in the background while receiving the reception signal.

The most important thing in the present invention is that phase comparator 2 forms the clock data recovering circuit including main signal discriminator 1. Therefore, the execution of process 3 (step S114) optimizes not only the main signal discrimination point, but also the operating point of phase comparator 2 forming phase synchronizing loop 200. As a result, the operating margin against the jitter and noise is improved.

In this way, repetition of processes 1 to 3 can realize the clock data recovering circuit that operates at the optimal discrimination point. Eye opening monitor 300 can operate independently from phase synchronizing loop 200. Therefore, the optimal discrimination point is detected in the background even if the reception or recovery of the reception signal is not stopped, and the optimal discrimination point is fed back to main signal discriminator 1. Thus, a stable clock data recovering circuit without code error can be realized even if the reception or recovery of the reception signal is not stopped.

Next, advantages will be described.

In the present exemplary embodiment, phase comparator 2 includes main signal discriminator 1. Main signal discriminator 1 discriminates the reception signal by the clock signal and generates recovery data indicating the discrimination result. Phase comparator 2 uses the discrimination result of main signal discriminator 1 to compare the phases of the reception signal and the recovery clock and outputs a phase comparison signal indicating the comparison result. The generator generates a recovery clock with a frequency corresponding to the comparison result indicated by the phase comparison signal outputted from phase comparator 2. Eye opening monitor 300 detects an optimal discrimination point of main signal discriminator 1 based on a monitor signal split from the reception signal and the recovery data generated by main signal discriminator 1. Eye opening monitor 300 also adjusts the discrimination point of main signal discriminator 1 based on the detection result.

In this case, phase comparator 2 includes main signal discriminator 1 and uses the discrimination result of main signal discriminator 1 to compare the phases of the reception signal and the recovery clock. The generator generates a recovery clock with a frequency corresponding to the comparison result. An optimal discrimination point of main signal discriminator 1 is detected, and based on the detection result, the discrimination point of main signal discriminator 1 is adjusted.

Therefore, optimization of the discrimination point of main signal discriminator 1 can also optimize the operating point of phase comparator 2. Thus, the operating point of the generator that generates the recovery clock can also be optimized, and thus, a stable recovery clock can be generated.

In the present exemplary embodiment, phase comparison signal offset adjuster 3 adjusts the phase of the phase comparison signal outputted from phase comparator 2. Eye opening monitor 300 adjusts the amount of adjustment of phase comparison signal offset adjuster 3 to adjust the discrimination phase of main signal discriminator 1.

In this case, the operating point of the generator can also be easily optimized.

In the present exemplary embodiment, main signal offset adjuster 100 adjusts the level of the reception signal. The eye opening monitor adjusts the amount of adjustment of main signal offset adjuster 100 to adjust the discrimination level of main signal discriminator 1.

In this case, the discrimination level of main signal discriminator 1 can be easily adjusted.

In the present exemplary embodiment, monitor discriminator 8 discriminates the monitor signal by monitor clock 25 to generate monitor data indicating the discrimination result. Error detection circuit 12 determines whether the monitor discrimination point and the main signal discrimination point are included in the same eye opening of the reception signal based on the monitor data and the recovery data. Monitor signal offset adjuster 9 adjusts the level of monitor signal 24. Monitor clock phase varying device 11 adjusts the phase of the recovery clock to generate monitor clock 25. Optimal discrimination point control circuit 13 sequentially adjusts the amount of adjustment of monitor signal offset adjuster 9 and the amount of adjustment of the monitor clock phase varying device to sequentially adjust the monitor discrimination points. Optimal discrimination point control circuit 13 also detects the optimal discrimination point of main signal discriminator 1 based on the determination results of error detection circuit 12 corresponding to the monitor discrimination points.

In this case, the clock data recovering circuit can be operated in the background even if the recovery operation of the reception signal is not stopped.

In the present exemplary embodiment, monitor clock phase varying device 11 includes a phase interpolator and generates a multiphase clock from a recovery clock signal. The phase interpolator generates a monitor clock signal of an intermediate phase from the multiphase clock signal.

In this case, digital control of monitor clock phase varying device 11 can be performed.

Furthermore, in the present exemplary embodiment, exclusive OR circuit 12a calculates exclusive ORs of the monitor data and the recovery data. Average value circuit 12b calculates the average value of the output signals of exclusive OR circuit 12a in a predetermined period. Comparator 12c determines whether the average value calculated by average value circuit 12b is greater than a predetermined threshold and determines whether the discrimination point of monitor discriminator 8 is included in the eye opening.

In this case, the accuracy of determining whether the discrimination point of monitor discriminator 8 is included in the eye opening can be improved.

[Second Exemplary Embodiment]

Figure 7:
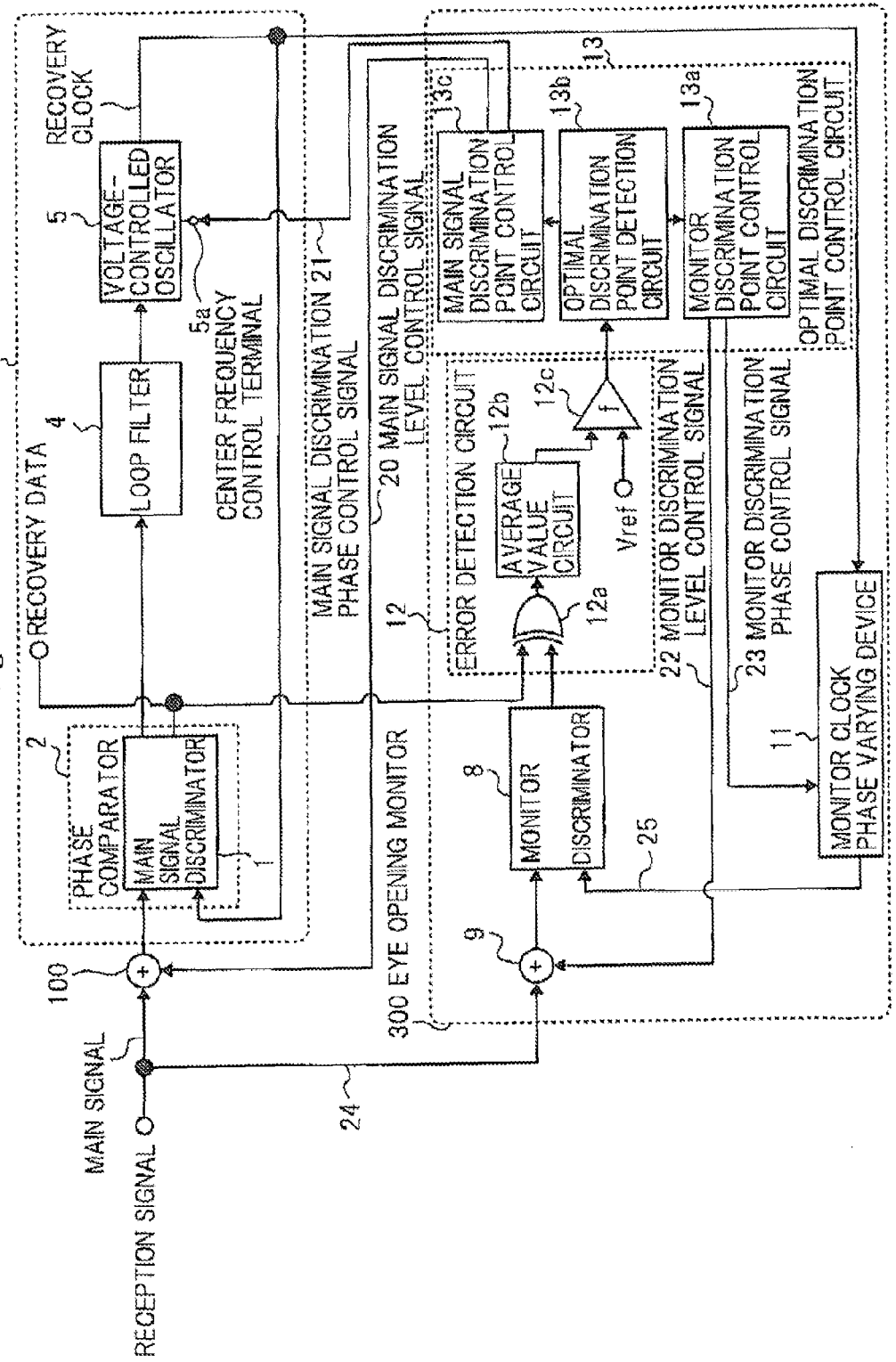
FIG. 7 is a block diagram of a configuration of a clock data recovering circuit of a second exemplary embodiment.

FIG. 7 is a block diagram of a clock data recovering circuit of a second exemplary embodiment. In FIG. 7, the clock data recovering circuit has a configuration in which phase comparison signal offset adjuster 3 is excluded from the configuration shown in FIG. 1. In addition, voltage-controlled oscillator 5 comprises center frequency control terminal 5a that receives main signal discrimination phase control signal 21.

The difference between the process executed by the clock data recovering circuit of the present exemplary embodiment and the process executed by the clock data recovering circuit of the first exemplary embodiment are as follows.

Optimal discrimination point control circuit 13 adjusts the center frequency of voltage-controlled oscillator 5 to adjust the discrimination phase of main signal discriminator 1.

Specifically, optimal discrimination point control circuit 13 outputs main signal discrimination phase control signal 21 to center frequency control terminal 5a of voltage-controlled oscillator 5. Voltage-controlled oscillator 5 adjusts the center frequency of the recovery clock according to main signal discrimination phase control signal 21 received by center frequency control terminal 5a.

Other than the difference, the clock data recovering circuit of the present exemplary embodiment is the same as the clock data recovering circuit of the first exemplary embodiment. Therefore, the same method as in the first exemplary embodiment can be applied to the process for detecting the optimal discrimination point and to other processes.

Next, advantages will be described.

The center frequency of the generator (specifically, voltage-controlled oscillator 5) is also controlled in the present exemplary embodiment. Therefore, an offset can be provided to a signal propagating in phase synchronizing loop 200. Thus, as in the first exemplary embodiment, the stationary phase error of phase synchronizing loop 200 can be controlled, and the operating point of phase comparator 2 comprising the discrimination phase of main signal discriminator 1 and phase synchronizing loop 200 can be optimized.

[Third Exemplary Embodiment]

Figure 8:
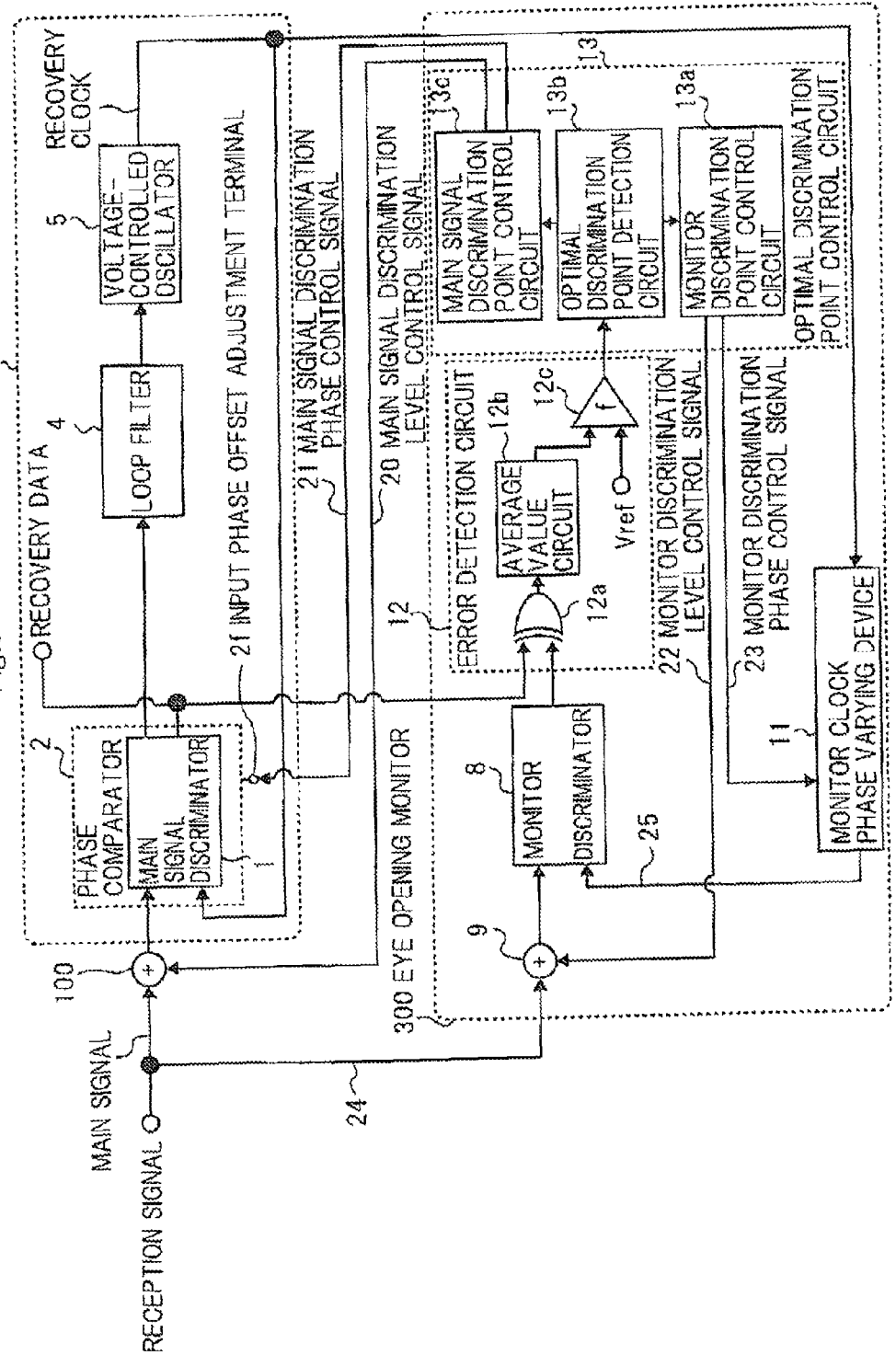
FIG. 8 is a block diagram of a configuration of a clock data recovering circuit of a third exemplary embodiment.

FIG. 8 is a block diagram of a clock data recovering circuit of a third exemplary embodiment. In FIG. 8, the clock data recovering circuit has a configuration in which phase comparison signal offset adjuster 3 is excluded from the configuration shown in FIG. 1. In addition, phase comparator 2 comprises input phase offset adjustment terminal 2f that receives main signal discrimination phase control signal 21.

The differences between the process executed by the clock data recovering circuit of the present exemplary embodiment and the process executed by the clock data recovering circuit of the first exemplary embodiment are as follows.

Main signal discriminator 1 adjusts the phase of the recovery clock and discriminates the main signal by the adjusted recovery clock. Optimal discrimination point control circuit 13 adjusts the amount of adjustment of main signal discriminator 1 to adjust the discrimination phase of main signal discriminator 1.

Specifically, optimal discrimination point control circuit 13 outputs to input phase offset adjustment terminal 2f of phase comparator 2. Main signal discriminator 1 of phase comparator 2 adjusts the phase of the recovery clock according to main signal discrimination phase control signal 21 received by input phase offset adjustment terminal 2f.

When the phase comparator shown in FIG. 2 is used as phase comparator 2, main signal discriminator 1 can be realized by, for example, arranging a delay circuit in front of the clock input terminals of flip-flops 2a and 2b and by main signal discrimination phase control signal 21 controlling the amount of delay.

Figure 9:
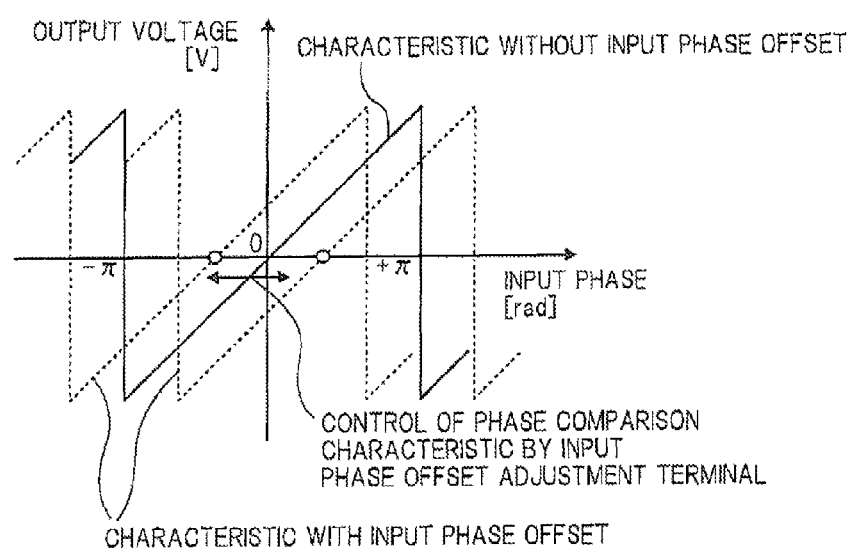
FIG. 9 is a diagram of a relationship between a phase comparison characteristic of the phase comparator and a control signal inputted to an input phase offset adjustment terminal.

FIG. 9 is a diagram showing the relationship between the phase comparison characteristics of phase comparator 2 and the control signal inputted to input phase offset adjustment terminal 2f. As shown in FIG. 9, as the control signal to input phase offset adjustment terminal 2f is controlled, the phase comparison characteristics move in parallel from side to side. Since a feedback is applied to phase synchronizing loop 200 to make the output of the phase comparator 0, moving the phase comparison characteristic in parallel from side to side can adjust the input phase offset of phase synchronizing loop 200. The present exemplary embodiment is characterized in that the characteristic is used to adjust the discrimination phase of the main signal discriminator.

As in the first and second exemplary embodiments, both the discrimination point of main signal discriminator 1 and the operating point of phase comparator 2 can be optimized in the present exemplary embodiment.

This application claims the benefit of priority based on Japanese Patent Application No. 2007-090445 filed Mar. 30, 2007, the entire disclosure of which is incorporated herein.

The invention claimed is:

1. A clock data recovering circuit comprising:
a comparator that includes a main discriminator that discriminates a reception signal by a clock signal to generate recovery data indicating the discrimination result, said comparator using the discrimination result of the main discriminator to compare phases of the reception signal and the clock signal and outputting a phase comparison signal indicating the comparison result;
a generator that generates the clock signal with a frequency corresponding to the comparison result indicated by the phase comparison signal outputted from said comparator; and
a monitor that detects an optimal discrimination point of the main discriminator based on a monitor signal split from the reception signal and recovery data generated by the main discriminator and for adjusts a discrimination point of the main discriminator based on the detection result.

2. The clock data recovering circuit according to claim 1, further comprising:
an offset adjustor that adjusters an offset of the phase comparison signal outputted from said comparator, wherein
said monitor adjusts the amount of adjustment of said offset adjustor to adjust a discrimination phase of said main discriminator.

3. The clock data recovering circuit according to claim 1, wherein:
said monitor adjusts a center frequency of said generator to adjust the discrimination phase of said main discriminator.

4. The clock data recovering circuit according to claim 1, wherein:
said main discriminator adjusts the phase of the clock signal to discriminate the reception signal by the adjusted clock signal, and
said monitor adjusts the amount of adjustment of the main discriminator to adjust the discrimination phase of the main discriminator.

5. The clock data recovering circuit according to claim 1, further comprising:
a level adjustor that adjusts a level of the reception signal, wherein
said monitor adjusts the amount of adjustment of said level adjustor to adjust a discrimination level of said main discriminator.

6. The clock data recovering circuit according to claim 1, wherein:
said monitor comprises:
a monitor discriminator that discriminates the monitor signal by a monitor clock signal to generate monitor data indicating the discrimination result;
a determiner that determines whether a discrimination point of the monitor discriminator and the discrimination point of said main discriminator are included in the same eye opening of the reception signal based on monitor data generated by the monitor discriminator and the recovery data generated by said main discriminator;
a monitor level adjustor that adjusters a level of the monitor signal;
a monitor clock phase adjustor that adjusters the phase of the clock signal to generate the monitor clock signal; and
a controller that sequentially adjusts the amount of adjustment of said monitor level adjustor and the amount of adjustment of said monitor phase adjustor to sequentially adjust the discrimination points of the monitor discriminator and detecting an optimal discrimination point of said main discriminator based on the determination results of said determiner corresponding to the discrimination points.

7. The clock data recovering circuit according to claim 1, wherein:
said monitor clock phase adjustor includes a phase interpolator and generates a multiphase clock from the clock signal, said phase interpolator generating the monitor clock signal of an intermediate phase from the multiphase clock signal.

8. The clock data recovering circuit according to claim 6, wherein:
said determiner comprises:
an exclusive OR circuit that calculates exclusive ORs of the monitor data and the recovery data;
calculator that calculates an average value of the output signals of said exclusive OR circuit in a predetermined period; and
a comparator that determines whether the average value calculated by said a calculator is greater than a predetermined threshold to determine whether the discrimination point of said monitor discriminator is included in the eye opening.

9. A control method of the clock data recovering circuit according to claim 1, the control method comprising:
repeating the processing operation of said clock data recovering circuit in the background while receiving the reception signal.

* * * * *